(12) United States Patent
Miura et al.

(10) Patent No.: US 6,340,941 B1
(45) Date of Patent: Jan. 22, 2002

(54) DIGITAL-SIGNAL FORMING CIRCUIT

(75) Inventors: Yoshinori Miura; Hideo Izumi, both of Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/441,129

(22) Filed: Nov. 17, 1999

(30) Foreign Application Priority Data

Dec. 14, 1998 (JP) .............................. 10-354693

(51) Int. Cl.[7] .................................. H03M 1/18
(52) U.S. Cl. ........................ 341/155; 341/139
(58) Field of Search ................ 341/155, 139, 341/127, 131, 160

(56) References Cited

U.S. PATENT DOCUMENTS 5,451,948 A * 9/1995 Jekel ........................ 341/139
5,812,077 A * 9/1998 Boie ........................ 341/118

FOREIGN PATENT DOCUMENTS

| JP | 5-129902 | 11/1991 |
| JP | 7-212269 | 8/1995 |

\* cited by examiner

*Primary Examiner*—Brain Young
(74) *Attorney, Agent, or Firm*—Brinks Hofer Gilson & Lione

(57) ABSTRACT

A digital-signal forming circuit demodulates a time-divisionally received signal, and shapes the demodulated signal by comparing the demodulated signal with a reference voltage. When a non-receiving time slot has a small interference signal, the digital-signal forming circuit uses, as the reference voltage, a direct-current voltage obtained by averaging the demodulated signal. When the non-receiving time slot has a large interference signal, the digital-signal forming circuit uses a predetermined direct-current voltage as the reference voltage.

7 Claims, 5 Drawing Sheets

SYNCHRONIZING SIGNAL Sy | COMMUNICATION DATA Sd

DIGITAL-SIGNAL FORMING CIRCUIT

BACKGROUND OF THE INVENTION

1. Field of the Invention

The present invention relates to a digital-signal forming circuit, which is used in a time-division multiplexing radio receiver, that uses a reference voltage generated in accordance with the strength of a demodulated signal obtained by demodulating a received signal in order to obtain a digital signal by shaping the demodulated signal into rectangular waves.

2. Description of the Related Art

Conventional time-division multiplexing radio receivers include a digital-signal forming circuit in which a demodulated signal obtained by demodulating a received signal is shaped into rectangular waves by comparing the demodulated signal with a reference voltage.

FIG. 3 shows main components of a conventional digital-signal forming circuit.

The conventional digital-signal forming circuit includes a demodulator 1, a signal comparator 2 composed of an operational amplifier, a make-and-break switch 3, a reference voltage unit 5, a controller 6 composed of a central processing unit (CPU) 6, an intermediate-frequency (IF) signal input terminal 21 to which an IF signal is input, and a digital signal output terminal 23. as shown in FIG. 3. The reference voltage unit 5 includes a resistor 11 connected across the input and output ends thereof, and a capacitor 14 connected to the output end so as to branch.

The demodulator 1 outputs a demodulated signal Sf by demodulating the IF signal. The comparator 2 outputs a digital signal by shaping the demodulated signal into rectangular waves, while the non-inverting input (indicated as "+" in FIG. 3) of the comparator 2 is being supplied with the demodulated signal and the inverting input (indicated as "−" in FIG. 3) of the comparator 2 is being supplied with a reference voltage. The control terminal of the make-and-break switch 3 is supplied with a make-and-break signal. The make-and-break switch 3 is turned on when the make-and-break signal is at high level, while it is turned off when the make-and-break signal is at low level. When the make-and-break switch is turned on, the demodulated signal is supplied from the demodulator 1 to the reference voltage unit 5. The reference voltage unit 5 uses averaging to convert the demodulated signal into a direct-current (dc) voltage, and applies the dc voltage as the reference voltage to the inverting input of the comparator 2. The controller 6 selectively outputs the high and low levels of the make-and-break signal.

FIG. 4 illustrates the operation of the make-and-break switch 3 in the conventional digital-signal forming circuit. In FIG. 4, time chart (A) shows time-slot condition, time chart (B) shows the contents of the received signal, time chart (C) shows strength-signal condition, and time chart (D) shows the condition of the make-and-break switch 3. FIGS. 5A and 5B illustrate the shaping of the demodulated signal Sf output from the demodulator 1 into rectangular waves.

With reference to FIGS. 3 to 5A and 5B, the operation of the conventional digital-signal forming circuit is described below.

A time T1, sufficiently before the start of a receiving-time slot period (hereinafter referred to simply as a "receiving slot"), has no received signal. Accordingly, the IF signal is not input to the IF signal input terminal 21, and the demodulator outputs no demodulated signal Sf, so that the comparator 2 outputs no digital signal including synchronizing signal Sy and communication data Sd. The controller 6 outputs the low-level make-and-break signal, which turns off the make-and-break switch 3. Thus, no demodulated signal Sf is supplied to the reference signal unit 5.

At a time T2 in a time slot positioned just before the receiving slot, the controller 6 outputs the high-level make-and-break signal, which turns on the make-and-break switch 3. At a time T3 from which the receiving slot begins, a signal modulated using the synchronizing signal Sy is received, and from a time T4, a signal modulated using communication data Sd is received. During the receiving slot, the demodulated signal Sf is output from the demodulator 1. The demodulated signal Sf is supplied to the non-inverting input of the comparator 2, and is supplied to the reference voltage unit 5 via the make-and-break switch 3 when it is turned on. The reference voltage unit 5 obtains a dc voltage Vf close to an average voltage by performing time-averaging on the demodulated signal Sf. The reference voltage unit 5 stores the dc voltage Vf in the capacitor 14, and applies it as the reference voltage to the inverting input of the comparator 2. By way of example, the demodulated signal Sf and the dc voltage Vf are shown in FIG. 5A.

The comparator 2 compares the voltage of the demodulated signal Sf with the dc voltage Vf. As shown in FIG. 5B, when the voltage of the demodulated signal Sf is not less than the dc voltage Vf, the output of the comparator 2 is at high level. When the voltage of the demodulated signal Sf is not greater than dc voltage Vf, the output of the comparator 2 is at low level. Accordingly, the demodulated signal Sf is shaped into rectangular waves, and the rectangular waves are supplied as the synchronizing signal Sy and the communication data Sd to the controller 6 and the digital signal output terminal 23.

As described above, the dc voltage Vf is obtained by averaging the demodulated signal Sf, in other words, it is the average voltage of the demodulated signal Sf. Therefore, the demodulated signal Sf is shaped into rectangular waves having equal widths, and the correct-width digital signal including the synchronizing signal Sy and the communication data Sd is obtained.

Finally, at time T5, the termination of the receiving slot causes the demodulator 1 not to output demodulated signal Sf, and the comparator 2 outputs no digital signal. Accordingly, the controller 6 outputs the low-level make-and-break signal, which turns off the make-and-break switch 3.

The above-described conventional digital-signal forming circuit is constructed so that the reference voltage is obtained in accordance with the average demodulated-signal voltage by turning on the make-and-break switch 3 in the period of the receiving slot. The make-and-break switch 3 cannot be turned on at the start time T3 of the receiving slot, due to variations in the characteristics of the components. Accordingly, the make-and-break switch 3 is turned on at time T2 just before the receiving slot so as to be turned on without a delay at the start time T3 of the receiving slot.

When another person uses an adjacent channel to perform transmission from a close place in the adjacent slot just before the receiving slot, the transmitted signal is input as an interference signal to the demodulator 1 from the time T2 at which the make-and-break switch 3 is turned on, to time T3 at which a transmitting slot from the person terminates. The demodulator 1 outputs the demodulated signal Sn based on the interference signal, and the dc voltage Vn in accordance with the demodulated signal Sn is stored in the capacitor 14 of the reference voltage unit 5. In general, the demodulated signal Sn is greater than the demodulated signal Sf, and the dc voltage Vn is greater than the dc voltage Vf.

In the case where the receiving slot begins at the time T3 when interference occurs, the comparator 2 slices the demodulated signal Sf, using the greater dc voltage Vn as a reference voltage. As a result, the demodulated signal Sf cannot be shaped into a correct-width digital signal, and synchronization cannot be established because first several bits of the synchronizing signal Sy are lost. This causes a problem in that communication may not be performed.

SUMMARY OF THE INVENTION

Accordingly, In order to solve the foregoing problem, it is an object of the present invention to provide a digital-signal forming circuit for obtain a complete synchronizing signal.

To this end, according to an aspect of the present invention, the foregoing object is achieved by providing a digital-signal forming circuit performing the steps of demodulating a time-divisionally received signal, shaping the demodulated signal into rectangular waves by implementing voltage comparison between the demodulated signal with a reference voltage, and outputting a digital signal obtained by shaping, wherein, when an interference signal is small in a non-receiving time-slot period which is not assigned for reception, a direct-current voltage obtained by averaging the demodulated signal is used as the reference voltage, and wherein, when the interference signal is large in the non-receiving time-slot period, a predetermined direct-current voltage is used as the reference voltage.

According to another aspect of the present invention, the foregoing object is achieved by providing a digital-signal forming circuit including: a demodulator for outputting a demodulated signal by demodulating a received signal; a signal comparator for shaping the demodulated signal into rectangular waves by performing voltage comparison between the demodulated signal and a reference voltage and outputting a digital signal obtained by shaping; an average-reference-voltage unit for outputting an average reference voltage by averaging the demodulated signal; a fixed-reference-voltage unit for outputting a fixed reference voltage having a predetermined voltage; a selection switch for selecting either of the two reference voltages and outputting the selected voltage to the signal comparator; a received-signal-strength detector for outputting a strength signal in accordance with the strength of the received signal; and a controller for controlling the selecting operation of the selection switch in accordance with the magnitude of the strength signal.

The controller may refer to the strength signal in a non-receiving time-slot period which is not assigned as a receiving time, and the controller may control the selecting operation of the selection switch so that the selection switch selects the average reference voltage when the strength signal being referred to is not more than a predetermined value and that the selection switch selects the fixed reference voltage when the strength signal being referred to is not less than the predetermined value.

The digital-signal forming circuit further includes a make-and-break switch for making and breaking the connection between the demodulator and the average-reference-voltage unit, and the controller may control the make-and-break switch so that, when the strength signal being referred to is not less than the predetermined value, and in a period in which the demodulated signal is a signal other than a synchronizing signal, the make-and-break switch is broken.

The average-reference-voltage unit may include a resistor connected across an input and output ends, two diodes connected across the input and output ends so that the polarities thereof are reverse, and a capacitor connected between the output end and the ground.

According to the present invention, when no interference occurs, an average reference voltage obtained in accordance with the voltage of a demodulated signal is used to perform the precise shaping of the demodulated signal, which forms a correct digital signal. In addition, when interference occurs in a non-receiving slot, a fixed reference voltage is not affected by the interference, and a correct digital signal can be formed from the demodulated signal.

DESCRIPTION OF THE PREFERRED EMBODIMENT

Figure 1:
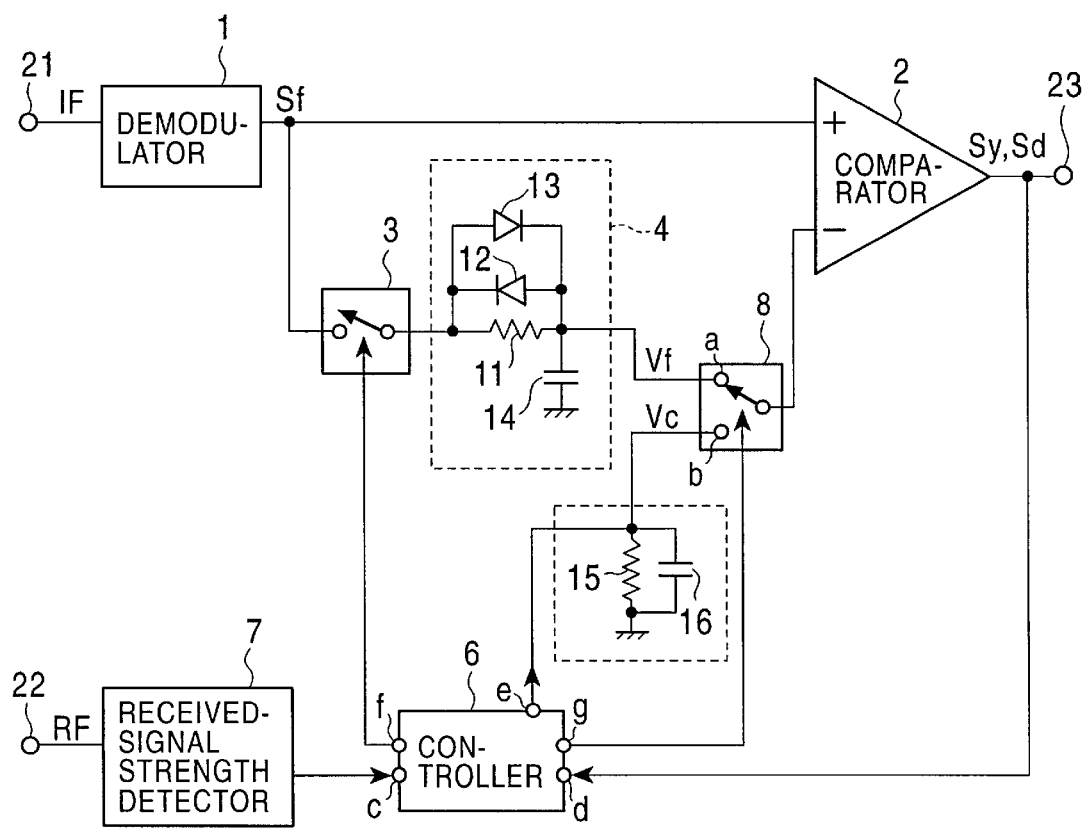
FIG. 1 is a circuit diagram showing the main components of a digital-signal forming circuit according to an embodiment of the present invention.

FIG. 1 shows the main components of a digital-signal forming circuit according to an embodiment of the present invention. Referring to FIG. 1, the present invention is described below.

The digital-signal forming circuit includes a demodulator 1, a signal comparator 2 composed of an operational amplifier, a make-and-break switch 3, an average-reference voltage unit 4, a controller 6 composed of a CPU, a received-signal strength detector 7, a selection switch 8 composed of one-circuit-two-contact switch, a fixed-reference-voltage unit 9, an IF signal input terminal 21 to which an IF signal is input, a radio-frequency-signal (RF-signal) input terminal 22 to which an RF signal is input, and a digital-signal output terminal 23.

The average-reference voltage unit 4 includes a resistor 11 connected across the input and output ends thereof, two diodes 12 and 13 connected across the input and output ends thereof so that their polarities are inverse, and a capacitor 14 connected between the output end and the ground. When the voltage of an input demodulated signal changes greatly, the voltage stored in the capacitor 14 is rapidly changed by the diodes 12 and 13 connected across the input and output ends of the average-reference voltage unit 4 so that their polarities are inverse.

The fixed reference voltage unit 9 includes a resistor 15 and a capacitor 16 which are connected in parallel across the input end thereof and the ground. The controller 6 is provided with a strength-signal input terminal c, a data-input terminal d, a fixed-voltage output terminal e, a fixed-voltage output terminal f, and a selection-signal output terminal g.

The demodulator 1 has an input end connected to the IF input terminal 21, and an output end connected to both the non-inverting input (indicated as "+" in FIG. 1) of the comparator 2 and one contact of the make-and-break switch 3. The average-reference voltage unit 4 has an input end connected to the other contact of the make-and-break switch 3 and an output end connected to one fixed contact a of the selection switch 8. The fixed-reference-voltage unit 9 is connected to the fixed-voltage output terminal e of the controller 6 and the other fixed contact b of the selection switch 8. The movable contact of the selection switch 8 is connected to the inverting input (indicated as "−" in FIG. 1) of the comparator 2. The output of the comparator 2 is connected to the digital-signal output terminal 23 and the data input terminal d of the controller 6. The received-signal strength detector 7 has an input end connected to the RF signal input terminal 22 and an output end connected to the strength-signal input terminal c. The fixed-voltage output terminal f of the controller 6 is connected to the control terminal of the make-and-break switch 3. The selection-signal output terminal g is connected to the control terminal of the selection switch 8.

The demodulator 1 outputs a demodulated signal by demodulating the IF signal. The comparator 2 outputs a digital signal by shaping the demodulated signal into rectangular waves, while the non-inverting input (+) of the comparator 2 is being supplied with the demodulated signal and the inverting input (−) of the comparator 2 is being supplied with a reference voltage. The control terminal of the make-and-break switch 3 is supplied with a make-and-break signal. The make-and-break switch 3 is turned on when the make-and-break signal is at high level, while it is turned off when the make-and-break signal is at low level. When the make-and-break switch 3 is turned on, the demodulated signal is supplied from the demodulator 1 to the average-reference voltage unit 4, and the average-reference voltage unit 4 uses averaging to convert the demodulated signal into a dc voltage. The average-reference voltage unit 4 stores it in the capacitor 14, and applies it to the fixed contact a of the selection switch 8. The fixed-reference-voltage unit 9 applies, to the fixed contact b of the selection switch 8, a dc voltage output from the fixed-voltage output terminal e of the controller 6. The control terminal of the selection switch 8 is supplied with a selection signal. When the selection signal is at high level, the fixed contact b and the movable contact are connected. When the selection signal is at low level, the fixed contact a and the movable contact are connected.

The received-signal strength detector 7 outputs a strength signal having high level when the strength of the RF signal is not less than a predetermined value, and outputs the strength signal having low level when the strength of the RF signal is not more than the predetermined value. The controller 6 refers to the strength signal and to the digital signal output from the comparator 2. When the strength signal is at low level, the controller 6 outputs the make-and-break signal at high level from a time just before the start of a synchronizing signal Sy to the end of the synchronizing signal Sy. In other cases, the controller 6 outputs the make-and-break signal at low level. The controller 6 also outputs the selection signal, whose logic level is equal to that of the strength level, from a time just before a receiving slot to the end of the receiving slot.

Figure 2:
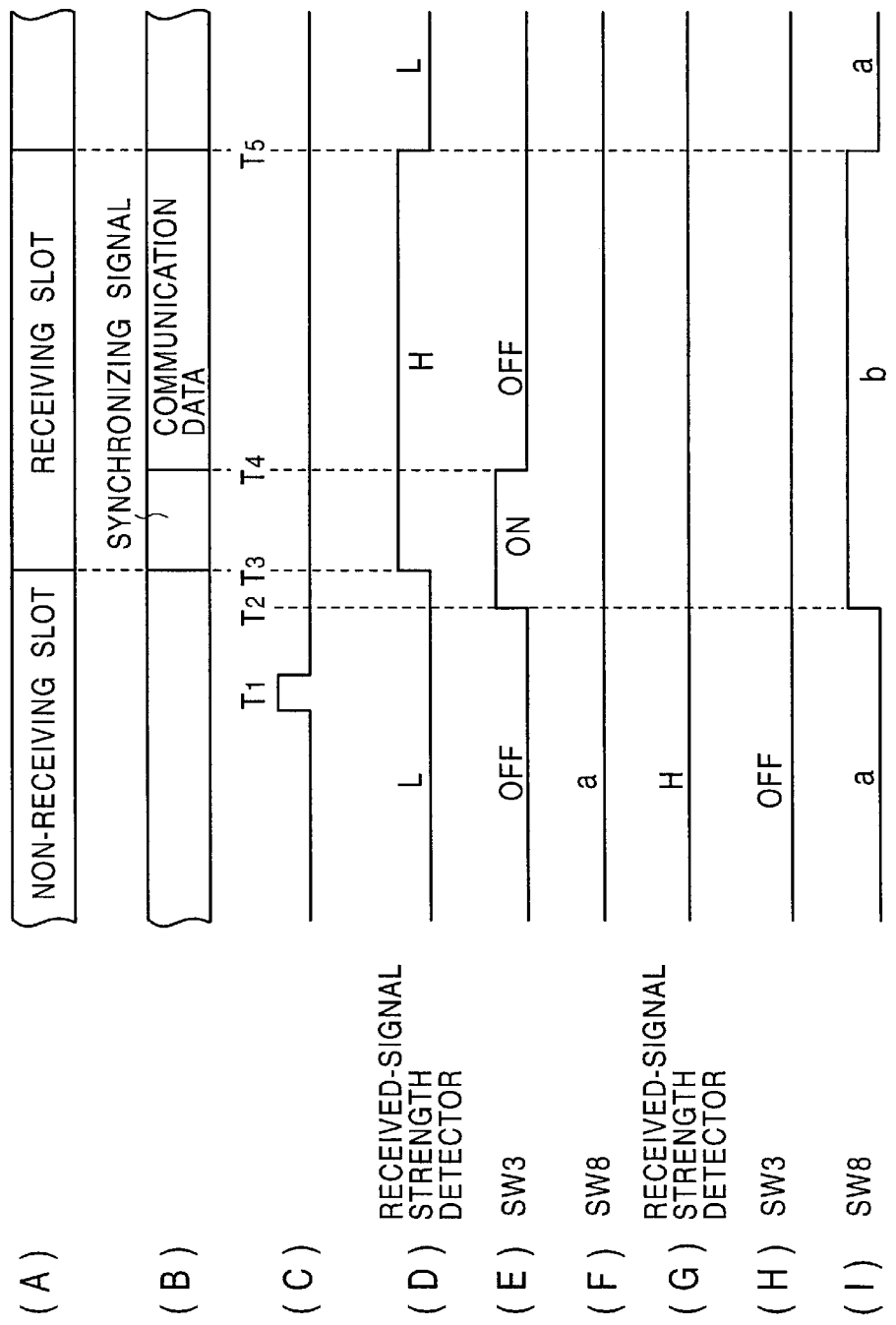
FIG. 2 comprises drawings showing the conditions of the main components of the digital-signal forming circuit shown in FIG. 1.
Figure 3:
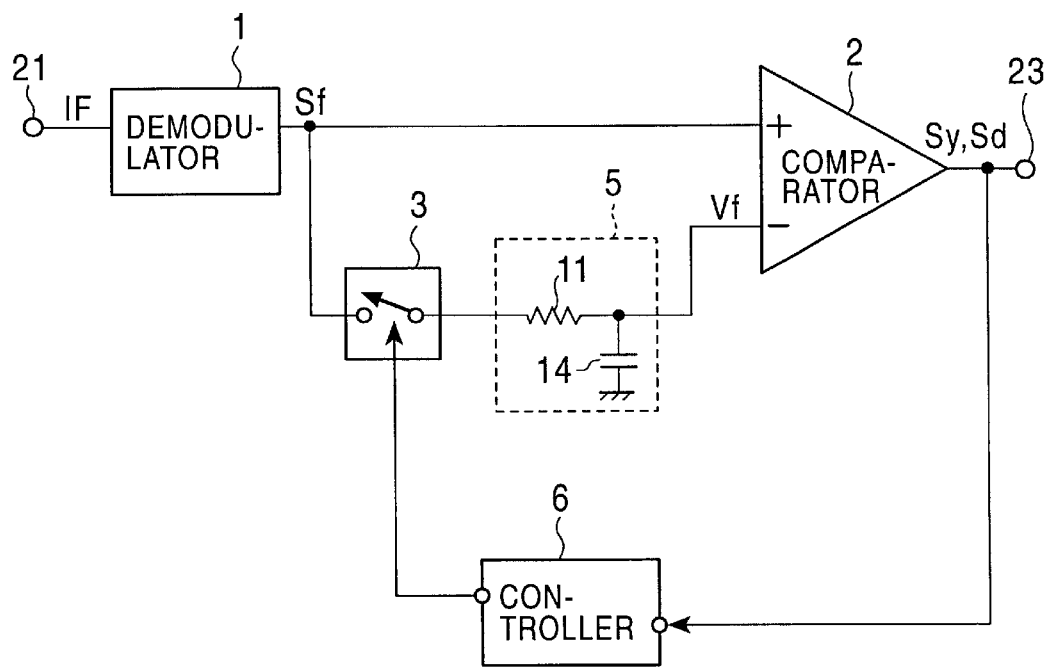
FIG. 3 is a circuit diagram showing the main components of a conventional digital-signal forming circuit.
Figure 4:
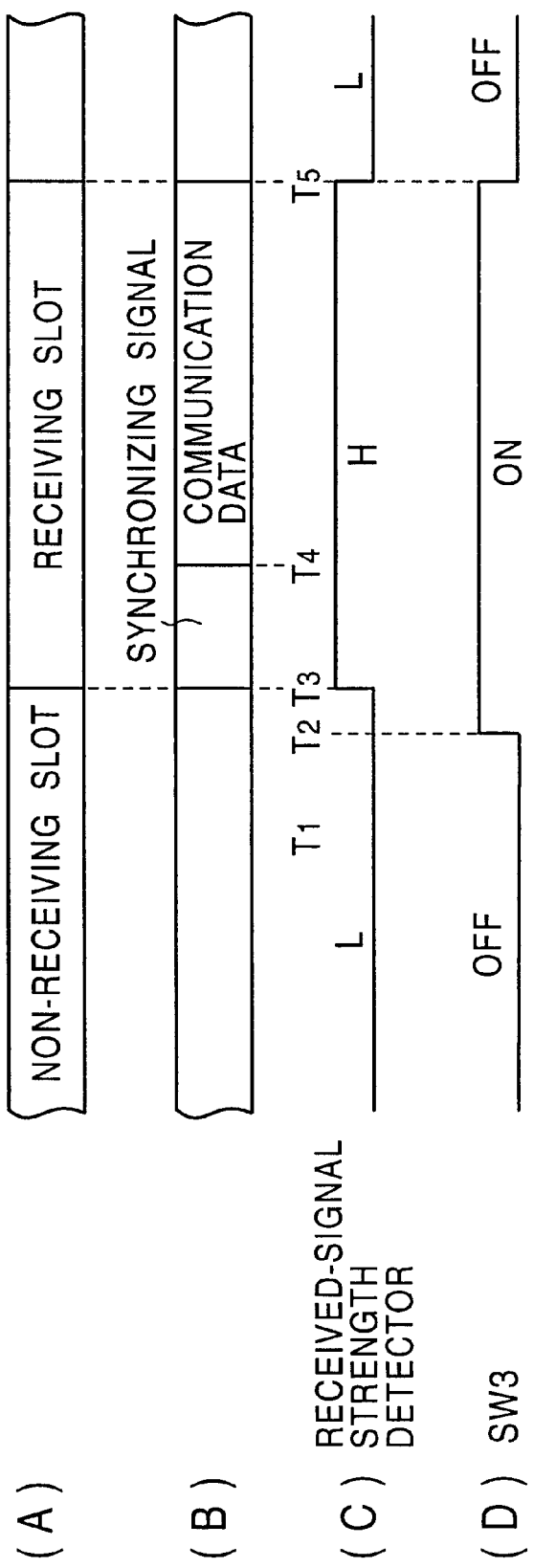
FIG. 4 comprises drawings showing the operating condition of a make-and-break switch 3 in the conventional digital-signal forming circuit shown in FIG. 3.
Figure 5A:
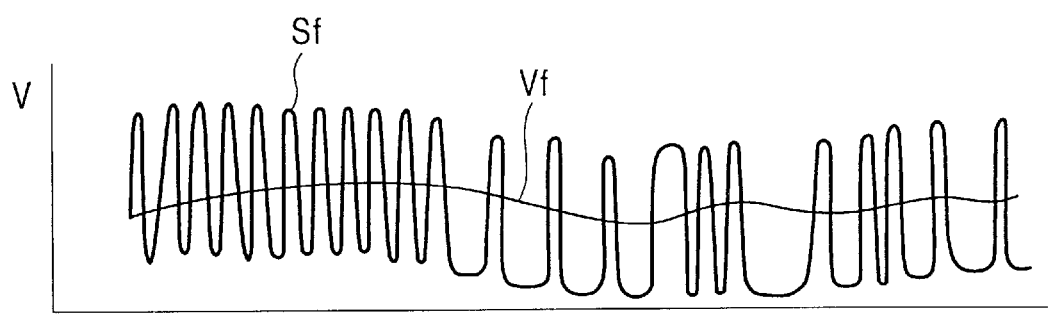
FIGS. 5A and 5B are illustrations of the shaping of a demodulated signal Sf into rectangular waves.
Figure 5B:
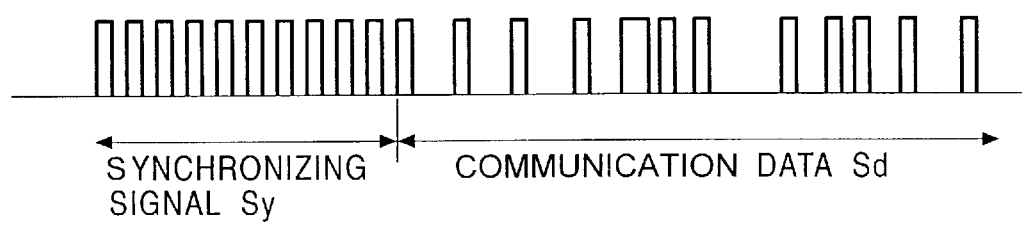

FIG. 2 illustrate the operating conditions of the components of the digital-signal forming circuit shown in FIG. 1. Time chart (A) shows time-slot condition. Time chart (B) shows the contents of the received signal. Time chart (C) shows timing for monitoring the strength signal. Time charts (D) to (F) show the operation of the digitalsignal forming circuit when a non-receiving slot has a small interference signal. Time chart (D) shows strength-signal condition, time chart (E) shows the operating condition of the make-and-break switch 3, and time chart (F) shows the operating condition of the selection switch 8. Time charts (G) to (I) show the operation of the digital-signal forming circuit when the non-receiving slot has a large interference signal. Time chart (G) shows strength-signal condition, time chart (H) shows the operating condition of the make-and-break switch 3, and time chart (I) shows the operating condition of the selection switch 8.

With reference to time charts (A) and (B) in FIG. 2, time-slot condition and the contents of the received signal are described below. A time T1 and a time T2 are positioned in a non-receiving slot that is not assigned as a receiving period. The time T1 is a time at which the strength signal output from the received-signal strength detector 7 is referred to by the controller 6. The time T2 is a time at which the make-and-break switch 3 or the selection switch 8 is switched in accordance with the condition of the strength signal being referred to. A time T3 to a time T5 are positioned in a receiving slot assigned as a receiving period. In the period between the time T3 and a time T4, the synchronizing signal Sy is received. In the period between the time T4 and the time T5, the communication data Sd is received.

With reference to FIGS. 1 and 2, the operation of the digital-signal forming circuit of the present invention is described below.

At the time T1 in the non-receiving slot that is not assigned as the receiving period, the controller 6 refers to the strength signal output from the received-signal strength detector 7. At this time, both the make-and-break signal and the selection signal, output from the controller 6, are at low level. Accordingly, the make-and-break switch 3 is broken, and the selection switch 8 selects the fixed contact a (the average-reference-voltage side).

When another person uses an adjacent channel to perform communication from a close place, the communication is input as an interference signal to the RF-signal input terminal 22. Thus, the strength signal is at high level. When the interference signal is not input to the RF-signal input terminal 22, the strength signal is at low level. Therefore, by using the level of the strength signal being referred to at the time T1 in the non-receiving slot, it is possible to determine whether interference occurs.

The operation of the digital-signal forming circuit, when the strength signal is at low level (no interference), is described below.

In this case, the selection signal is unchanged to be at low level, and the selection switch 8 selects the fixed contact a (the average-reference-voltage side). At the time T2, the make-and-break switch 3 is closed by changing the make-and-break signal to be at high level. At the time T4, the make-and-break switch 3 is opened by changing the make-and-break signal to be at low level.

At the time T3 at which the receiving slot starts, the IF signal modulated using a synchronizing signal Sy is input to the demodulator 1, and a demodulated signal Sf is output from the demodulator 1. The demodulated signal Sf is supplied to the non-inverting input of the comparator 2, and is supplied to the average-reference voltage unit 4 via the make-and-break switch 3, so that the demodulated signal Sf is converted into an average reference voltage Vf. The average reference voltage Vf is supplied to the inverting input of the comparator 2, and a synchronizing signal Sy shaped into rectangular waves are output from the comparator 2.

Successively, at the time T4, the IF signal, modulated using communication data Sd instead of the synchronizing signal, is input to the demodulator 1, and the make-and-break switch 3 is simultaneously opened, so that the demodulated signal Sf is not supplied to the average reference voltage unit 4. The average reference voltage Vf stored in the capacitor 14 is supplied to the inverting input of the comparator 2, and the communication data Sd shaped into rectangular waves are output from the comparator 2. The synchronizing signal Sy and the communication data Sd are supplied to the digital-signal output terminal 23 and the controller 6. Finally, the receiving slot ends at the time T5.

The operation of the digital-signal forming circuit, when the strength signal is at high level (i.e., interference occurs), is described below.

In this case, the make-and-break signal is unchanged to be at low level, and the make-and-break switch 3 is continuously opened. The selection switch 8 is switched to the fixed contact b (the fixed-reference-voltage side) by changing the selection signal at the time T2 to be at high level. At the time T5, by changing the selection signal to be at low level, the selection switch 8 is switched to the fixed contact a (the average-reference-voltage side). Accordingly, during the receiving slot from the time T3 to the time T5, a fixed reference voltage Vc is supplied to the inverting input of the comparator 2, and the synchronizing signal Sy and the communication data Sd, shaped into rectangular waves, are output from the comparator 2 to the the digital-signal output terminal 23 and the controller 6.

What is claimed is:

1. A digital-signal forming circuit comprising:
   an intermediate frequency demodulator to output a demodulated intermediate frequency signal by demodulating an intermediate frequency received signal;
   a signal comparator to shape the demodulated signal into rectangular waves by performing a voltage comparison between the demodulated signal and a reference voltage and to output the rectangular waves as a digital signal;
   an average-reference-voltage circuit to output an average reference voltage by averaging the demodulated signal;
   a fixed-reference-voltage circuit to output a fixed reference voltage having a predetermined voltage;
   a selection switch to select either of the two reference voltages and output the selected voltage to said signal comparator;
   a make-and-break switch to one of enable and disable a connection between said demodulator and said average-reference-voltage circuit;
   a radio-requency-received-signal-strength detector to output a strength signal in accordance with the strength of a radio-frequency received signal; and
   a controller to control the selecting operation of said selection switch in accordance with the magnitude of the strength signal.

2. A digital-signal forming circuit according to claim 1, wherein said controller receives the strength signal in a non-receiving time-slot period, and said controller controls the selecting operation of said selection switch such that said selection switch selects the average reference voltage when the received strength signal is not more than a predetermined value and that said selection switch selects the fixed voltage when the received strength signal is not less than the predetermined value.

3. A digital-signal forming circuit according to claim 2, wherein said controller controls said make-and-break switch such that, when the received strength signal is not less than the predetermined value, and in a period in which the demodulated signal is not a synchronizing signal, said make-and-break switch disables the connection between said demodulator and said average-reference-voltage circuit.

4. A digital-signal forming circuit according to claim 1, wherein said average -reference-voltage circuit comprises a resistor connected across an input and output end of the average-reference-voltage circuit, two diodes connected across the input and output ends such that the polarities thereof are reverse, and a capacitor connected between the output end and the ground.

5. A digital-signal forming circuit according to claim 1, wherein:
   the demodulated signal includes a synchronizing signal;
   said received-signal-strength detector detects the strength of the received radio-frequency signal and outputs said strength signal at a high level when the strength of the received radio-frequency signal is not less than a predetermined value and outputs said strength signal at a low level when the strength of the received radio-frequency signal is not more than the predetermined value; and
   said controller receives the digital signal output from said signal comparator and receives said strength signal and outputs a high-level make/break signal from immediately prior to the start of the synchronizing signal until the termination of the synchronizing signal when the low level strength signal is received and otherwise outputs a low-level make/break signal.

6. A digital-signal forming circuit according to claim 1, wherein the fixed reference voltage is a DC voltage.

7. A digital-signal forming circuit according to claim 1, wherein said average-reference-voltage circuit comprises an input end and an output end, the input end connected with the make-and-break switch and the output end connected with the selection switch, a resistor connected across the input and output ends, a first diode connected in parallel with the resistor and having an anode connected with the input end, a second diode connected in parallel with the resistor and the first diode and having a cathode connected with the input end, and a capacitor connected between the output end and ground.

* * * * *